US008736816B2

(12) United States Patent
Krasnoperova (10) Patent No.: US 8,736,816 B2
(45) Date of Patent: May 27, 2014

(54) ASYMMETRIC COMPLEMENTARY DIPOLE ILLUMINATOR

(75) Inventor: Azalia A. Krasnoperova, Court Mahwah, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/415,106

(22) Filed: Mar. 8, 2012

(65) Prior Publication Data

US 2012/0173211 A1   Jul. 5, 2012

Related U.S. Application Data

(62) Division of application No. 12/396,503, filed on Mar. 3, 2009.

(51) Int. Cl.
*G03B 27/32* (2006.01)
*G03B 27/54* (2006.01)
*G03F 7/20* (2006.01)

(52) U.S. Cl.
CPC ........ *G03F 7/70125* (2013.01); *G03F 7/70091* (2013.01); *G03F 7/701* (2013.01); *G03F 7/70141* (2013.01)
USPC .............................................. 355/77; 355/67

(58) Field of Classification Search
CPC ....... G03F 7/70; G03F 7/70091; G03F 7/701; G03F 7/70125; G03F 7/70141
USPC ................ 353/97; 355/53, 55, 67, 69, 71, 77; 359/894; 430/5, 30, 312, 396; 438/689; 703/1; 716/50–56
See application file for complete search history.

(56) References Cited

U.S. PATENT DOCUMENTS

| 6,855,486 B1 | 2/2005 | Finders et al. |
| 6,876,437 B2 | 4/2005 | Kawahara |

(Continued)

FOREIGN PATENT DOCUMENTS

| CN | 1947063 A | 4/2007 |
| EP | 0493655 A2 | 7/1992 |

(Continued)

OTHER PUBLICATIONS

International Search Report and Written Opinion of the International Searching Authority for International Application No. PCT/EP2010/051972; Mail Date Jul. 5, 2010; 10 pages.

(Continued)

*Primary Examiner* — Toan Ton
*Assistant Examiner* — Colin Kreutzer
(74) *Attorney, Agent, or Firm* — Schmeiser, Olsen & Watts; Katherine Brown (57) ABSTRACT

An apparatus, a method of designing the apparatus, a tool using the apparatus and a method of using the apparatus for optimizing optical photolithography during formation of integrated circuits. The apparatus includes: an asymmetrical complementary dipole element including: first and second openings being equidistant and minor images about a first axis, the first and second openings having essentially a same first area and a same first optical density relative to a selected wavelength of light; third and fourth openings being equidistant and minor images about a second axis, the third and fourth openings having essentially a same second area, and a same second optical density relative to the selected wavelength of light; and wherein the first axis is perpendicular to the second axis and the first and second optical densities are different.

9 Claims, 7 Drawing Sheets

(56) References Cited

U.S. PATENT DOCUMENTS

| | | |
|---|---|---|
| 7,046,339 B2 | 5/2006 | Stanton |
| 7,283,205 B2 | 10/2007 | Mackey et al. |
| 7,339,652 B2 | 3/2008 | Moukara et al. |
| 8,687,170 B2 | 4/2014 | Krasnoperova |
| 2002/0075468 A1 | 6/2002 | Antoni |
| 2005/0195379 A1 | 9/2005 | Stanton et al. |
| 2005/0221233 A1 | 10/2005 | Minvielle et al. |
| 2006/0126046 A1* | 6/2006 | Hansen ................. 355/55 |
| 2006/0158633 A1 | 7/2006 | Macket et al. |
| 2006/0170895 A1 | 8/2006 | Fiolka |
| 2007/0031744 A1 | 2/2007 | Crouse et al. |
| 2007/0092839 A1 | 4/2007 | Tan et al. |
| 2007/0177123 A1 | 8/2007 | Tel et al. |
| 2008/0043214 A1 | 2/2008 | Mack et al. |
| 2008/0239272 A1 | 10/2008 | Wang et al. |
| 2009/0004581 A1 | 1/2009 | Fukuhara et al. |
| 2010/0225893 A1 | 9/2010 | Krasnoperova |
| 2010/0255679 A1* | 10/2010 | Wang et al. ............ 438/689 |
| 2012/0170017 A1 | 7/2012 | Krasnoperova |

FOREIGN PATENT DOCUMENTS

| | | |
|---|---|---|
| EP | 1186956 | 3/2002 |
| JP | 6251219 A | 3/1987 |
| JP | 06-061122 | 3/1994 |
| WO | 2005103828 | 11/2005 |

OTHER PUBLICATIONS

Office Action (Mail Date Feb. 1, 2012) for U.S. Appl. No. 12/396,503, filed Mar. 3, 2009.
U.S. Appl. No. 13/414,954, filed Mar. 8, 2012.
Amendment filed Apr. 27, 2012 in response to Office Action (Mail Date Feb. 1, 2012) for U.S. Appl. No. 12/396,503, filed Mar. 3, 2009.
Final Office Action (Mail Date Jul. 6, 2012) for U.S. Appl. No. 12/396,503, filed Mar. 3, 2009.
Amendment filed Aug. 23, 2012 in response to Final Office Action (Mail Date Jul. 6, 2012) for U.S. Appl. No. 12/396,503, filed Mar. 3, 2009.
Advisory Action (Mail Date Aug. 23, 2012) for U.S. Appl. No. 12/396,503, filed Mar. 3, 2009.
Advisory Action (Mail Date Sep. 19, 2012) for U.S. Appl. No. 12/396,503, filed Mar. 3, 2009.
Notice of Appeal filed Sep. 21, 2012 for U.S. Appl. No. 12/396,503, filed Mar. 3, 2009.
App. No. 201080010182.0, filed Feb. 17, 2010, SIPO Office Action dated May 24, 2013, prepared by Song Shan.
Office Action (Mail Date Feb. 28, 2013) for U.S. Appl. No. 13/414,954, filed Mar. 8, 2012.
Amendment filed May 17, 2013 in response to Office Action (Mail Date Feb. 28, 2013) for U.S. Appl. No. 13/414,954, filed Mar. 8, 2012.
Office Action (Mail Date Feb. 27, 2013) for U.S. Appl. No. 12/396,503, filed Mar. 3, 2009.
Office Action (Letter restarting period for response) (Mail Date Apr. 22, 2013) for U.S. Appl. No. 12/396,503, filed Mar. 3, 2009.
Final Office Action (Mail Date Aug. 5, 2013) for U.S. Appl. No. 13/414,954, filed Mar. 8, 2012.
Amendment filed Jul. 15, 2013 in response to Office Action (Mail Date Apr. 22, 2013) for U.S. Appl. No. 12/396,503, filed Mar. 3, 2009.
Notice of Allowance (Mail Date Nov. 19, 2013) for U.S. Appl. No. 13/414,954, filed Mar. 8, 2012.
Final Office Action (Mail Date Oct. 22, 2013) for U.S. Appl. No. 12/396,503, filed Mar. 3, 2009.
Amendment filed Dec. 13, 2013 in response to Final Office Action (Mail Date Oct. 22, 2013) for U.S. Appl. No. 12/396,503, filed Mar. 3, 2009.

* cited by examiner

ASYMMETRIC COMPLEMENTARY DIPOLE ILLUMINATOR

RELATED APPLICATIONS

This Application is a division of U.S. patent application Ser. No. 12/396,503 filed on Mar. 3, 2009.

FIELD OF THE INVENTION

The present invention relates to the field of integrated circuit manufacture and; more specifically, it relates to an apparatus, a method of designing the apparatus, a tool using the apparatus and a method of using the apparatus for optimizing optical photolithography during formation of integrated circuits.

BACKGROUND OF THE INVENTION

Leading edge integrated circuit technology requires optical photolithography to operate near it's theoretical resolution limit. While many methods of accomplishing this have been proposed, they do not accomplish their goal of tight image size control unless the length to width ratio of the printed images is very high and are further compromised when there is a mixture of images having minimum dimensions and images having significantly greater than minimum dimensions in the same exposure field. Accordingly, there exists a need in the art to mitigate or eliminate the deficiencies and limitations described hereinabove.

SUMMARY OF THE INVENTION

A first aspect of the present invention is an optical lithography apparatus, comprising: an asymmetrical complementary dipole element comprising: first and second openings being equidistant and minor images about a first axis, the first and second openings having essentially a same first area and a same first optical density relative to a selected wavelength of light; third and fourth openings being equidistant and mirror images about a second axis, the third and fourth openings having essentially a same second area, and a same second optical density relative to the selected wavelength of light; and wherein the first axis is perpendicular to the second axis and the first and second optical densities are different.

A second aspect of the present invention is a method for providing a light pattern on a photoresist layer, comprising: passing light of a selected wavelength through openings of an asymmetrical complementary dipole element, the asymmetrical complementary dipole element comprising: first and second openings being equidistant and mirror images about a first axis, the first and second openings having essentially a same first area and a same first optical density relative to the selected wavelength of light; third and fourth openings being equidistant and mirror images about a second axis, the third and fourth openings having essentially a same second area, and a same second optical density relative to the selected wavelength of light; and wherein the first axis is perpendicular to the second axis and the first and second optical densities are different; after passing the light through the asymmetrical complementary dipole element, passing the light through a patterned photomask; and after passing the light through the patterned photomask, projecting the light onto the photoresist layer.

A third aspect of the present invention is an apparatus for providing a light pattern having first and second intensities on a photoresist layer, comprising: an asymmetrical complementary dipole element aligned between a light source and a photomask, the photomask aligned between the asymmetrical complementary dipole element and the photoresist layer, the asymmetrical complementary dipole element comprising: first and second openings being equidistant and mirror images about a first axis, the first and second openings having essentially a same first area and a same first optical density relative to the selected wavelength of light; third and fourth openings being equidistant and mirror images about a second axis, the third and fourth openings having essentially a same second area, and a same second optical density relative to the selected wavelength of light; and wherein the first axis is perpendicular to the second axis and the first and second optical densities are different.

A fourth aspect of the present invention is a method of designing an asymmetrical complementary dipole element, comprising: (a) selecting critical design images of a photomask of an integrated circuit fabrication level; (b) selecting or generating an initial asymmetrical complementary dipole design and designating the initial design asymmetrical complementary dipole design as a current asymmetrical complementary dipole design, the current asymmetrical complementary dipole design having at least first dipole passing a first intensity of light and a second dipole passing a second intensity of light, the first intensity of light different from the second intensity of light; (c) simulating exposure of a photoresist layer using first parameters describing the critical design images and second parameters describing the current asymmetrical complementary dipole design to generate simulated images of the critical design images; (d) evaluating third parameters describing the simulated image; and (e) if the parameters are not acceptable, modifying one or more of the second parameters and repeating steps (c) and (d) and if the third parameters are acceptable, selecting the current asymmetrical complementary dipole design.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Generally, in the semiconductor industry, wafers are thin, disc shaped substrates having diameters of 100 to 300 mm and comprising a semiconductor based material. However, wafers may assume other shapes and/or sizes. Examples of wafers include bulk silicon substrates and silicon-on-insulator (SOI) substrates where a silicon layer is separated from a supporting silicon base silicon substrate by an insulating layer. Wafers may include doped and undoped semiconductor regions, doped and undoped epitaxial layers, dielectric layers including electrical conductors, and features such as transistors formed in/on the semiconductor material depending upon the particular stage of fabrication of the integrated circuit.

A photolithographic process is one in which a photoresist layer is applied to a surface (e.g. of a wafer), the photoresist layer exposed to actinic radiation through a patterned photomask and the exposed photoresist layer developed to form a patterned photoresist layer. When the photoresist layer comprises positive photoresist, the developer dissolves the regions of the photoresist exposed to the actinic radiation and does not dissolve the regions where the patterned photomask blocked (or greatly attenuated the intensity of the radiation) from impinging on the photoresist layer. When the photoresist layer comprises negative photoresist, the developer does not dissolve the regions of the photoresist exposed to the actinic radiation and does dissolve the regions where the patterned photomask blocked (or greatly attenuated the intensity of the radiation) from impinging on the photoresist layer. After further processing (e.g., an etch or an ion implantation), the patterned photoresist is removed.

A patterned photomask generally comprises a layer that is substantially opaque to actinic radiation having a pattern of openings therein. The layer is formed on a substrate that is substantially transparent to the actinic radiation. Actinic radiation can pass through the openings in the layer and through the substrate exposed in the openings.

Figure 1:
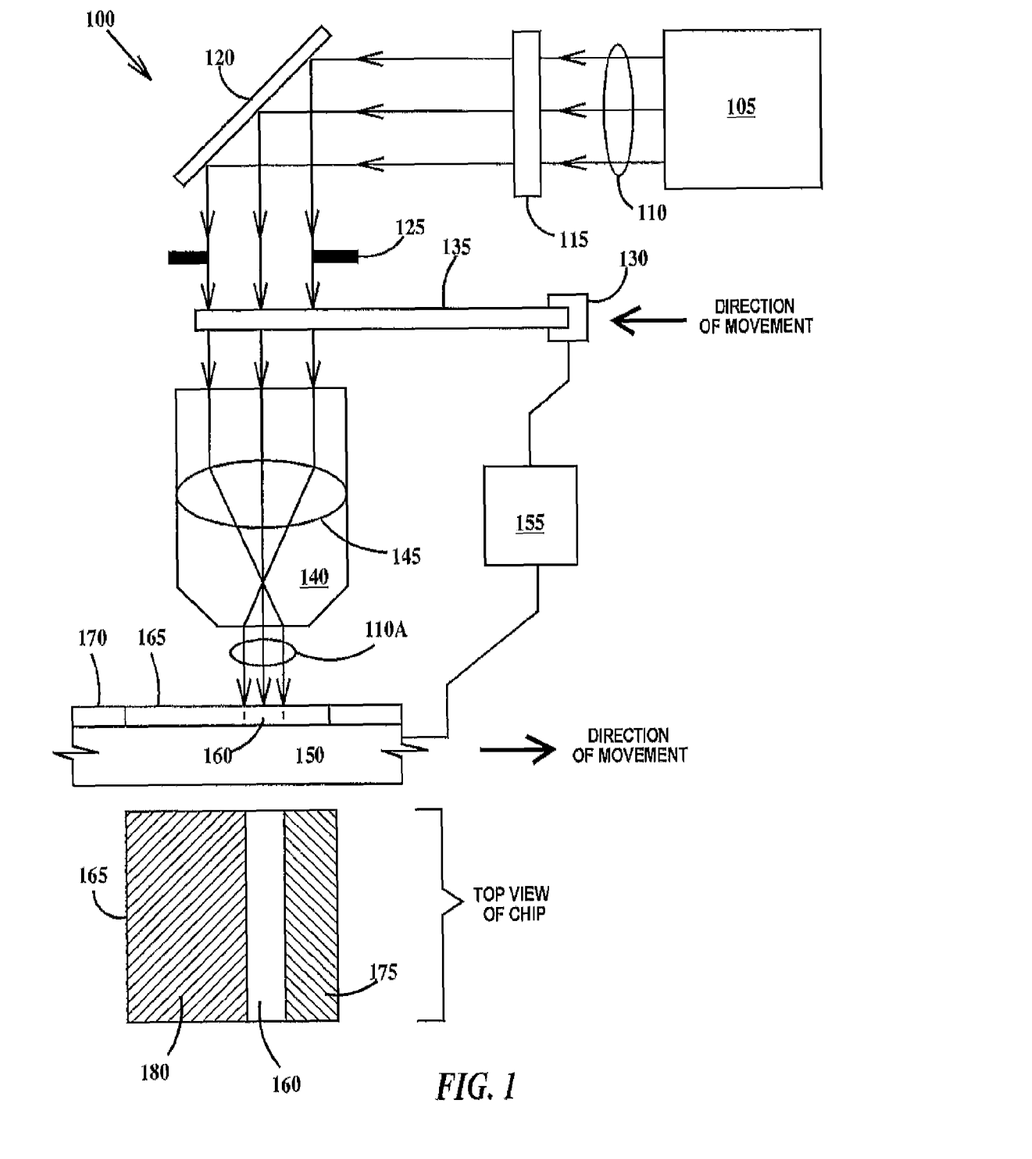
FIG. 1 depicts an exemplary optical photolithography tool comprising an asymmetric complementary dipole element according to embodiments of the present invention.

FIG. 1 depicts an exemplary optical photolithography tool comprising an asymmetric complementary dipole element according to embodiments of the present invention. In FIG. 1, a photolithography tool 100 includes a actinic radiation source e.g., UV light source) 105 generating a light beam (e.g., UV light of 193 nm wavelength) 110, an asymmetric complementary dipole (ACD) element 115, a reflector 120, an optional fixed slit 125, a reticle scan mechanism 130, a reduction element 140 including a reduction lens 145, a scanable stepper stage 150 and a control unit 155 for coordinating the movement of reticle scan mechanism 130 and stage 150.

Photolithography tool 100 is an example of a reduction exposure tool where light beam 110 is N times wider than reduced light beam 110A emerging from reduction element 140 so the pattern on reticle 135 is N times larger than the pattern to be printed. In one example N=5. ACD element 115A is a novel type of diffractive optical element (DOE).

In the manufacture of integrated circuits (ICs), a two dimensional array of up to several hundred individual IC chips are fabricated at the same time although the reticle (which is a is a type of photomask) may contain patterns for only a few IC chips. Thus the wafer must be moved (i.e., stepped) after each exposure. Also, the pattern on the reticle may be larger than can be contained in the maximum useable field of the lenses of the photolithography tool, so the reticle must be moved (i.e., scanned) so only portions of the pattern on the reticle are projected at any given instant. Thus in FIG. 1, a region 160 of an IC chip 165 on a wafer 170 (having a photoresist layer formed thereon) is exposed to reduced light beam 110A. IC chip 165 would be scanned (in the present example, from left to right) and then the wafer 170 stepped to the next IC chip and the scanning process repeated. At the bottom of FIG. 1, a "top view of chip" diagram illustrates that a region 175 of IC chip 165 has been exposed, region 160 is being exposed and region 180 remains to be exposed at a particular instant of time.

It should be understood, that the inventive ACD element 115 may be used in any number of projection photolithography tools (e.g., full IC chip projection stepper tools where N>1, and scan projection tools where N=1) other than the particular projection tool illustrated in FIG. 1. Further the particular location of ACD element 115 may vary from that illustrated in FIG. 1. For example, ACD 115 may be positioned adjacent to or in place of slit 125.

Figure 2:
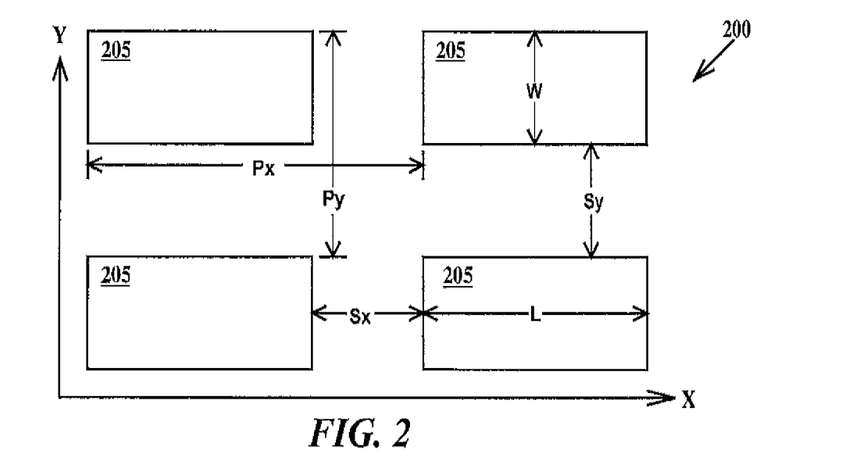
FIG. 2 is a plan view of exemplary designed images to be photolithographically printed using an asymmetric complementary dipole element according to embodiments of the present invention.

FIG. 2 is a plan view of exemplary designed images to be photolithographically printed using an asymmetric complementary dipole element according to embodiments of the present invention. In FIG. 2, an array 200 of design images 205 which constitute a portion of a pattern to be formed in a photoresist layer are arranged in rows along the X-direction and columns along the Y-direction. The X and Y-directions are perpendicular to each other. The X-direction defines a horizontal and lengthwise direction and the Y-direction defines a vertical and widthwise direction. Each image has a length L +/−d1 in the X-direction and a width W +/−d2 in the Y-direction, where d1 is a specification limit around L and d2 is a specification limit around W. Images 205 are spaced apart a distance Sx in the X-direction and a distance Sy in the Y-direction. Thus the pitch Px of images 205 in the X-direction is equal to L+Sx and the pitch Py of images in Y-direction is equal to W+Sy. Given the conditions that W<L, Py<Px, and T2<T1, then the critical direction in terms of image size control and pattern density is the Y-direction. This is important because ACD elements according to embodiments of the present invention include a first (i.e., critical) dipole that performs image resolution enhancement in the critical direction and a second (i.e., complementary) dipole that performs image resolution enhancement in the direction that is not the critical direction (e.g., the direction perpendicular to the critical direction).

Figure 3:
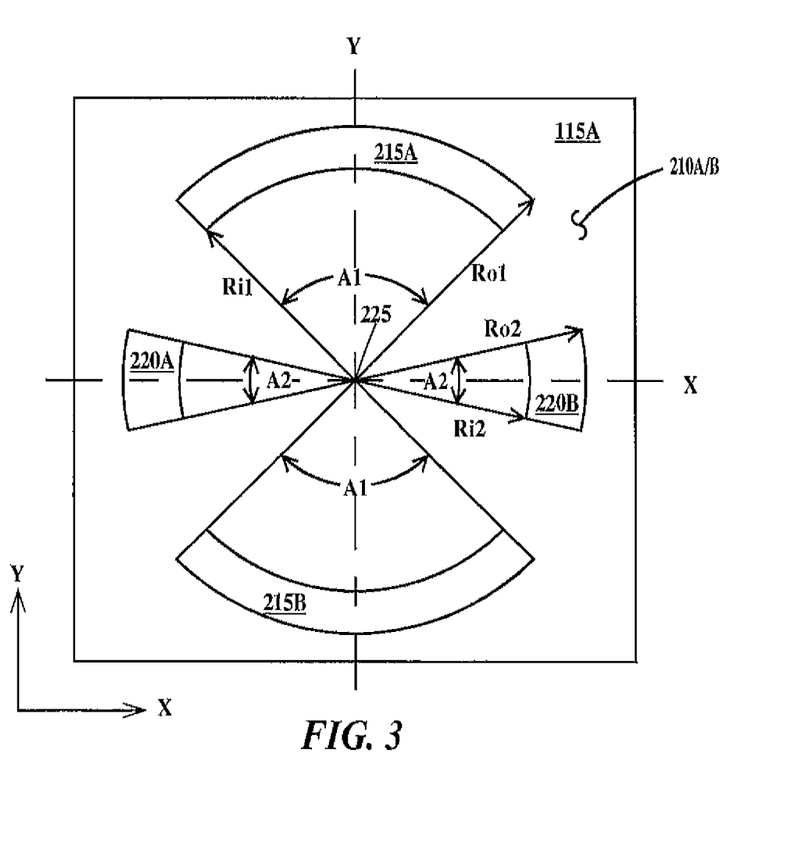
FIGS. 3 and 4 are a top views of a same asymmetric complementary dipole element according to embodiments of the present invention.
Figures 4, 5A:
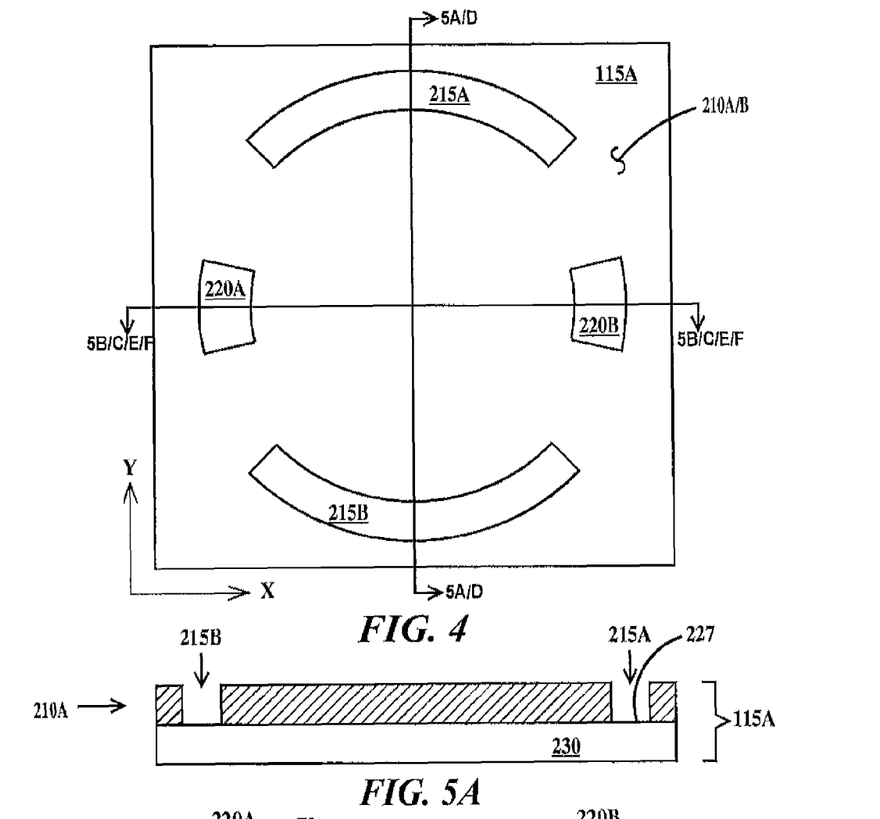
FIGS. 5A and 5B are cross-sections illustrating a first exemplary structure for the asymmetric complementary dipole element of FIG. 4, through respective lines 5A-5A and 5B-5B.

FIGS. 3 and 4 are a top views of a same asymmetric complementary dipole element according to embodiments of the present invention. In FIG. 3, an ACD element 115A (which represents ACD element 115 of FIG. 1) includes an opaque layer 210A or plate 210B and four openings 215A, 215B, 215C and 215D through which light can pass. First and second openings 215A and 215B are substantially arc-shaped and minor images about an X-axis (extending along the X-direction). Third and fourth openings 220A and 220B are substantially arc-shaped and minor images about a Y-axis (extending along the Y-direction). A central point 225 is defined by the intersection of the X and Y-axes. First and second openings 215A and 215B are defined on first and second sides by concentric arcs having an arc length of A1 degrees and are defined on third and fourth sides by nonparallel lines having a radial length extending from distance Ri1 to a distance Ro1 from central point 225 where Ro1>Ri1. Third and fourth openings 220A and 220B are defined on first and second sides by concentric arcs having an arc length of A2 degrees and are defined on third and fourth sides by nonparallel lines having a radial length extending from a distance Ri2 to a distance Ro2 from central point 225, where Ro2>Ri2. Thus the area of openings 215A and 215B are essentially the same and the areas of openings 220A and 220B are essentially the same and smaller than openings 215A and 215B.

ACD element 115A is intended to be used to expose array 200 of FIG. 2, so openings 215A and 215B form the critical dipole and openings 220A and 220B form the complementary dipole. Note openings 215A and 215B of the critical dipole extend primarily along the non-critical direction and openings 220A and 220B extend primarily along the critical direction as defined supra in relation to FIG. 2. It is a critical feature of the present invention that more light energy per unit time (e.g., mJ/sec) pass through openings 215A and 215B (the critical dipole) than through openings 220A and 220B (the complementary dipole). The relative amount of light passing through the critical and complementary dipoles is a function of the ratio A1/A2. Given the optical density (OD) of openings 215A and 215B is $OD_{CRIT}$ and the OD of openings 220A and 220B is $OD_{COMP}$, the relative amount of light passing through the critical and complementary dipoles is a function of ratio $OD_{CRIT}/OD_{COMP}$. An OD of zero is 100% clear, all light passing through and an OD of 1 is 100% opaque, no light passing through. A secondary control is the ratio of the areas of openings 215A and 215B to the areas of openings 220A and 220B. In one example, A1 is greater than A2. In one example, $OD_{COMP}$ is greater than $OD_{CRIT}$. In one example, A1 is greater than A2 and $OD_{COMP}$ is greater than $OD_{CRIT}$. In one example A1 is between about 45° and about 120° and A2 is between about 20° and about 50°.

FIG. 4 is similar to FIG. 3 except the X and Y-axes and dimensional indicators illustrated in FIG. 3 have been removed and cross-section indicators added to FIG. 4.

Figures 5B, 5C:
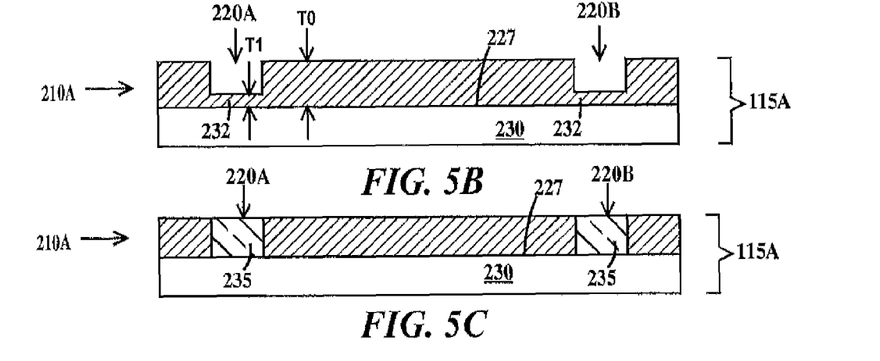
FIG. 5C is a cross-section through line 5C-5C of FIG. 4, illustrating an alternative structure for the asymmetric complementary dipole element illustrated in FIG. 5B.

FIGS. 5A and 5B are cross-sections illustrating an exemplary first structure for the asymmetric complementary dipole element of FIG. 4, through respective lines 5A-5A and 5B-5B. In FIG. 5A, ACD element 115A includes opaque layer 210A is formed on top surface 227 of a clear substrate 230 (e.g., having an OD close to zero). Top surface 227 of substrate 230 is exposed in the bottom of openings 215A and 215B. Strictly speaking, the OD of openings 215A and 215B is 0, but the OD of substrate 230 contributes to the attenuation of light passing through openings 215A and 215B so $OD_{CRIT}$ is equal to the OD of substrate 230. In one example, $OD_{CRIT}$ is less than about 0.1.

In FIG. 5B, top surface 227 of substrate 230 is not exposed in the bottom of openings 220A and 220B because a region 232 of opaque layer 210 remains at the bottom of openings 220A and 220B. Layer 210 has a thickness T0 and region 232 has a thickness T1, where T0>T1 and the OD of openings 220A is greater than the OD of openings 215A and 215B of FIG. 5A. In one example, layer 210 comprises chrome and substrate 230 comprise quartz. Strictly speaking, the OD of openings 220A and 220B is 0, but the OD of substrate 230 and the OD of region 232 both contribute to the attenuation of light passing through openings 220A and 220B so $OD_{COMP}$ is equal to the OD of substrate 230 plus the OD of region 232. In one example $OD_{COMP}$ is between about 0.2 and about 0.9. In one example $OD_{COMP}$ is between about 0.2 and about 0.9 and $OD_{CRIT}$ is less than about 0.1.

FIG. 5C is a cross-section through line 5C-5C of FIG. 4, illustrating an alternative structure for the asymmetric complementary dipole element illustrated in FIG. 5B. In FIG. 5C, openings 220A and 220B extend to top surface 227 of substrate 230 but are filled (alternatively, partially filled) with a light attenuating material 235. Material 235 has an OD greater than 0 but less than 1. In one example, the OD of material 235 is between about 0.1 and about 0.9. In one example, the OD of material 235 is between about 0.2 and about 0.5. Strictly speaking, the OD of openings 220A and 220B is 0, but the OD of substrate 230 and the OD of material 235 both contribute to the attenuation of light passing through openings 220A and 220B so $OD_{COMP}$ is equal to the OD of substrate 230 plus the OD of material 235. In one example $OD_{COMP}$ is between about 0.2 and about 0.9. In one example $OD_{COMP}$ is between about 0.2 and about 0.9 and $OD_{CRIT}$ is less than about 0.1.

Figure 5D:
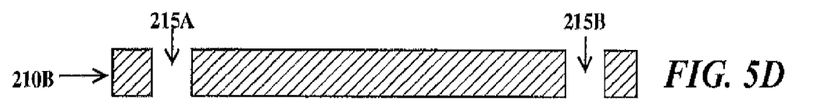
FIGS. 5D and 5E are cross-sections illustrating a second exemplary structure for the asymmetric complementary dipole element of FIG. 4, through respective lines 5D-5D and 5E-5E.
Figure 5E:
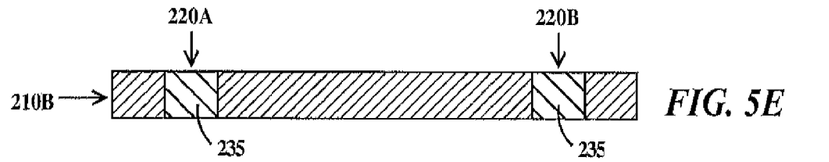

FIGS. 5D and 5E are cross-sections illustrating a second exemplary structure for the asymmetric complementary dipole element of FIG. 4, through respective lines 5D-5D and 5E-5E. In FIG. 5D, ACD element 115A includes opaque plate 210 having openings 215A and 215B. In one example plate 210B comprises aluminum, stainless steel, or a ceramic. In The OD of openings 215A and 215B are 0 so $OD_{CRIT}$ is equal 0.

In FIG. 5E, openings 220A and 220B are filled (alternatively, partially filled) with a light attenuating material 235. The OD of openings 220A and 220B are the OD of material 235 so $OD_{COMP}$ is equal to the OD of material 235. In one example $OD_{COMP}$ is between about 0.2 and about 0.9. In one example $OD_{COMP}$ is between about 0.2 and about 0.9 and $OD_{CRIT}$ is 0.

Figure 5F:
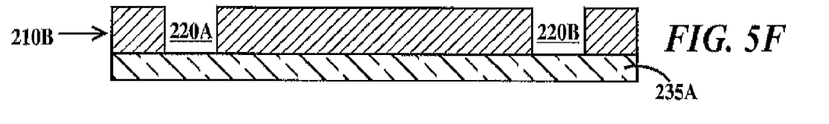
FIG. 5F is a cross-section through line 5F-5F of FIG. 4, illustrating an alternative structure for the asymmetric complementary dipole element illustrated in FIG. 5E.

FIG. 5F is a cross-section through line 5F-5F of FIG. 4, illustrating an alternative structure for the asymmetric complementary dipole element illustrated in FIG. 5E. Neutral density filters 235A are placed under plate 210. The OD of openings 220A and 220B are the OD filters 235A so $OD_{COMP}$ is equal to the OD of plate 235A. In one example $OD_{COMP}$ is between about 0.2 and about 0.9. In one example $OD_{COMP}$ is between about 0.2 and about 0.9 and $OD_{CRIT}$ is less than about 0.1.

Figure 6A:
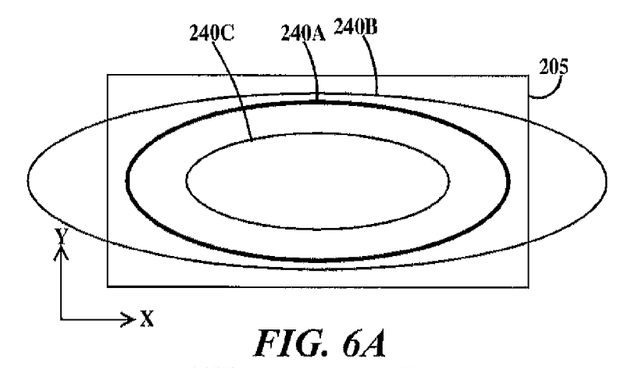
FIG. 6A is a simulation of a printed image using a single dipole element and FIG. 6B is a simulation of a printed image using an asymmetric complementary dipole element according to embodiments of the present invention.
Figure 6B:
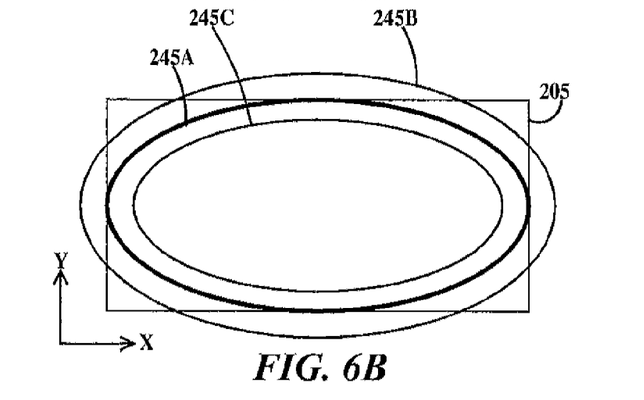

FIG. 6A is a simulation of a printed image using a single dipole element and FIG. 6B is a simulation of a printed image using the asymmetric complementary dipole element according to embodiments of the present invention. Simulation models are complex computer programs that simulate image parameters such as mean image dimensions and limits (e.g., 3 sigma) around the mean that could be expected in actual production. The simulation model may also take into account photomask compensation such as etch bias and optical proximity corrections (OPC) added to the design images when fabricating the photomask images. A simulation model may include information about the images (e.g., dimensions, geometries, and image variations) on the photomask, variations induced by the photoresist composition and photoresist processes (e.g., exposure time/intensity, process temperature, develop parameters, etc) and characteristics of the photolithography tool (e.g., resolution and image distortions and DOE effects) and generate a simulated image.

In FIG. 6A, a mean sized shape 240A, a maximum sized shape 240B and a minimum sized shape 240C of a simulated printed image are superimposed on design shape 205 (see also FIG. 2) using a simple dipole element similar to that depicted in FIG. 4 but having only openings 215A and 215B and not having openings 220A and 220B. In FIG. 6B, a mean sized shape 245A, a maximum sized shape 245B and a minimum sized shape 245C of a simulated printed image are superimposed on design shape 205 (see also FIG. 2) using ACD element 115A depicted in FIG. 4. Other than differences between the simple dipole element and the ACD element, the simulation model of FIGS. 6A and 6B are the same. In the two simulations, referring to FIG. 2, W was about 20 nm, L was about 40 nm, Sx was about, 20 nm and Sy was about 20 nm. For the simulation represented by FIG. 6A, referring to FIG. 3, A1 was about 90° and the OD of openings 215A and 215B was about 0, there being no openings 220A and 220B. For the simulation represented by FIG. 6B, referring again to FIG. 3, A1 was about 90°, A2 was about 30°, the OD of openings 215A and 215B was about 0, and the OD of openings 220A and 220B was about 0.3. An inspection of FIGS. 6A and 6B reveals that the single dipole simulation resulted in poor image size control (mean and tolerance about the mean) relative to design image 205 in both the critical direction (i.e., Y-direction) and the complementary direction (i.e., X-direction) and exhibited large image size variations in the complementary direction.

Figure 7:
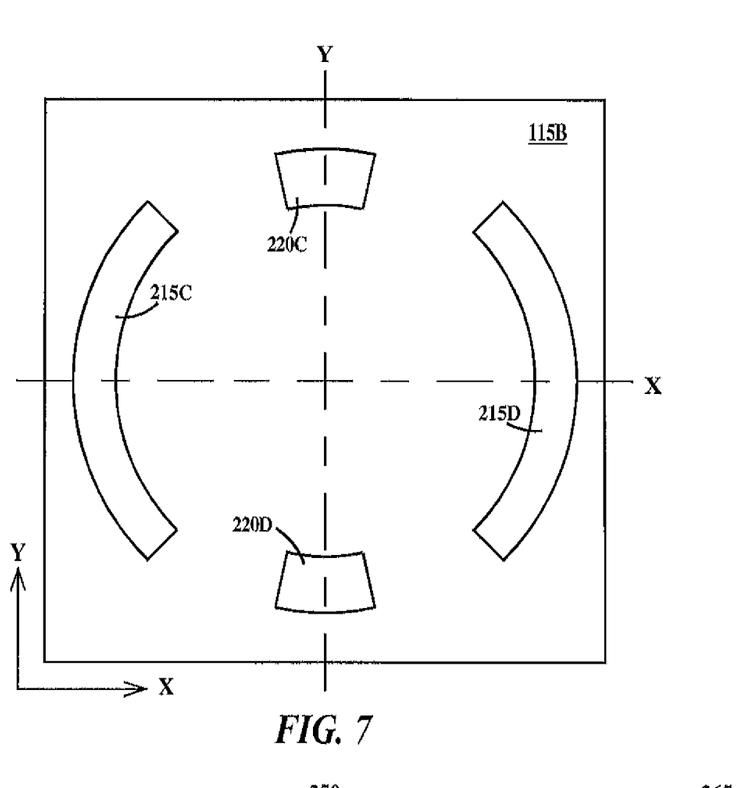
FIG. 7 is a top view of a companion asymmetric complementary dipole element according to be used in double dipole photolithography in conjunction with the asymmetric complementary dipole element of FIG. 4 according to embodiments of the present invention.

FIG. 7 is a top view of a companion asymmetric complementary dipole element for use in double dipole photolithography in conjunction with the asymmetric complementary dipole element of FIG. 4 according to embodiments of the present invention. ACDs according to the embodiments of the present invention have a critical dipole tuned to the critical image dimension direction and a complementary dipole tuned to the complementary image dimension direction (which is normally perpendicular to the critical direction). However, integrated circuit designs can have some images for which the Y-direction is the critical direction (as in FIG. 2) and other images for which the critical dimension is the X-direction. Therefore two masks and two ACD elements are required to expose a single photoresist layer correctly. A first mask 200 having horizontal bar images 205 (see FIG. 2) and where the Y-direction is the critical direction would be exposed using ACD element 115A (see FIG. 3) and a second mask having vertical bar images (rotate elements 205 of FIG. 2 by 90° and where the Y-direction is the critical direction) would be exposed using an ACD element 115B of FIG. 7. The use of ACD elements 115A and 115B are explained infra in reference to FIG. 8. ACD element 115B has four openings 215C, 215D, 220C and 220D through which light can pass. Openings 215C and 215D form the critical dipole and openings 220C and 220C form the complimentary dipole. Comparing ACD element 115B to ACD element 115A of FIG. 4 it can be seen that a major difference is a 90° rotation of the position of the critical and complementary dipoles. In the example of FIGS. 4 and 7, ACD 115A (see FIG. 4) and ACD element 115B are identical except for the 90° rotational offset of the critical dipoles (openings 215A and 215B of FIG. 4 and openings 215C and 215D of FIG. 7) and complementary dipoles (openings 220A and 220B of FIG. 4 and openings 220C and 220D of FIG. 7). However, ACD 115B need not be identical to ACD element 115A (see FIG. 4). ACD elements 115A (see FIG. 4) and 115B may be individually tuned to critical shapes and spacing of the masks they are intended to used with in respective critical directions irrespective of the tuning of the other ACD element.

Figure 8:
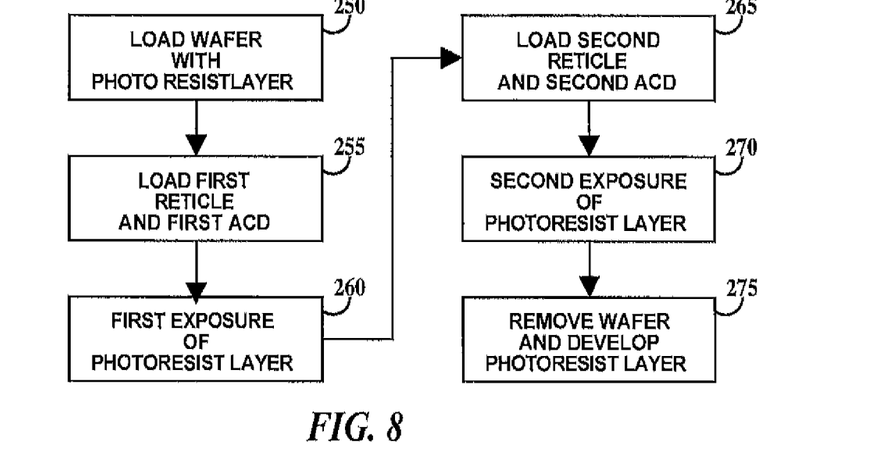
FIG. 8 is a flowchart illustrating a method of double dipole photolithography according to embodiments of the present invention.

FIG. 8 is a flowchart illustrating a method of double dipole photolithography according to embodiments of the present invention. In step 250, a wafer having a photoresist layer is loaded into an exposure tool. In step 255 a first reticle having critical a pattern of those images in a first critical direction is loaded into position in the optical path of the exposure tool and a first ACD element having a critical dipole orientated and tuned relative to the first critical direction is loaded into position in the optical path of the exposure tool. In step 260, a first exposure of the photoresist layer is performed using the first reticle and the first ACD element. In step 265 a second reticle having critical a pattern of those images in a second critical direction (perpendicular to the first critical direction) is loaded into position in the optical path of the exposure tool and a second ACD element having a critical dipole orientated and tuned relative to the second critical direction is loaded into position in the optical path of the exposure tool. In step 270, a second exposure of the photoresist layer is performed using the second reticle and the second ACD element. In step 275, the wafer is removed from the photolithography tool and the latent image formed by the two exposures developed. Further processing (e.g., etching, ion implantation, resist removal etc.) may then be performed.

Figure 9:
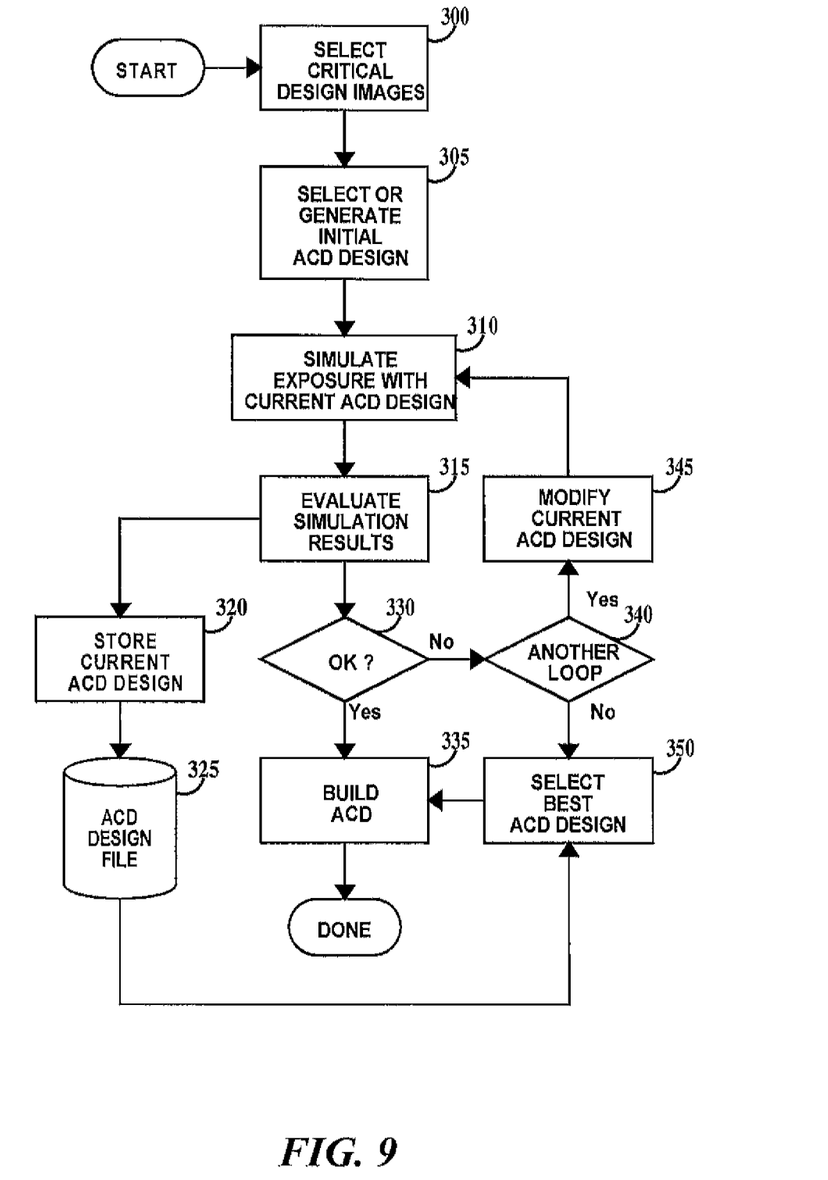
FIG. 9 is a method of designing asymmetric complementary dipole elements according to embodiments of the present invention.

FIG. 9 is a method of designing asymmetric complementary dipole elements according to embodiments of the present invention. In step 300 critical design images of a design of an IC fabrication level are selected. The parameters W, L, Sx, and Sy, (or W, L, Px and Py) (see FIG. 2) are inputted to the simulation model. In step 305 an initial ACD design is selected or generated and the parameters A1, A2, Ri1, Ro1, Ri2, Ro2, $OD_{CRIT}$ and $OD_{COMP}$ (see FIG. 3) are inputted to the simulation model. The initial asymmetrical complementary dipole design is designated as a current asymmetrical complementary dipole design. In step 310, the simulation model is run and in step 315 an evaluation of the results (see for example, FIG. 6B) is performed. Optionally in step 320, the current ACD design is stored in an ACD design file 325. In step, 330, based on the evaluation performed in step 315, it is determined if the current ACD design results in acceptable imaging performance. If in step, the imaging performance is acceptable then in step 335 an ACD element is fabricated based on the current design, otherwise the method proceeds to step 340. In step 340 it is determined if the current ACD design should be modified and the simulation performed again. If in step 340, it is decided to modify the current ACD design then in step 345 one or more of the parameters A1, A2, Ri1, Ro1, Ri2, Ro2, $OD_{CRIT}$ and $OD_{COMP}$ are modified and the method proceeds to step 310, otherwise the method proceeds to step 350. In step 350, the best performing ACD design is selected from ACD design file 325 and in step 335 an ACD is fabricated based on the selected design.

Generally, the method described herein with respect to designing asymmetric complementary dipole elements according to embodiments of the present invention is practiced with a general-purpose computer and the methods described supra in the flow diagrams of FIG. 4 may be coded as a set of instructions on removable or hard media for use by the general-purpose computer.

Figure 10:
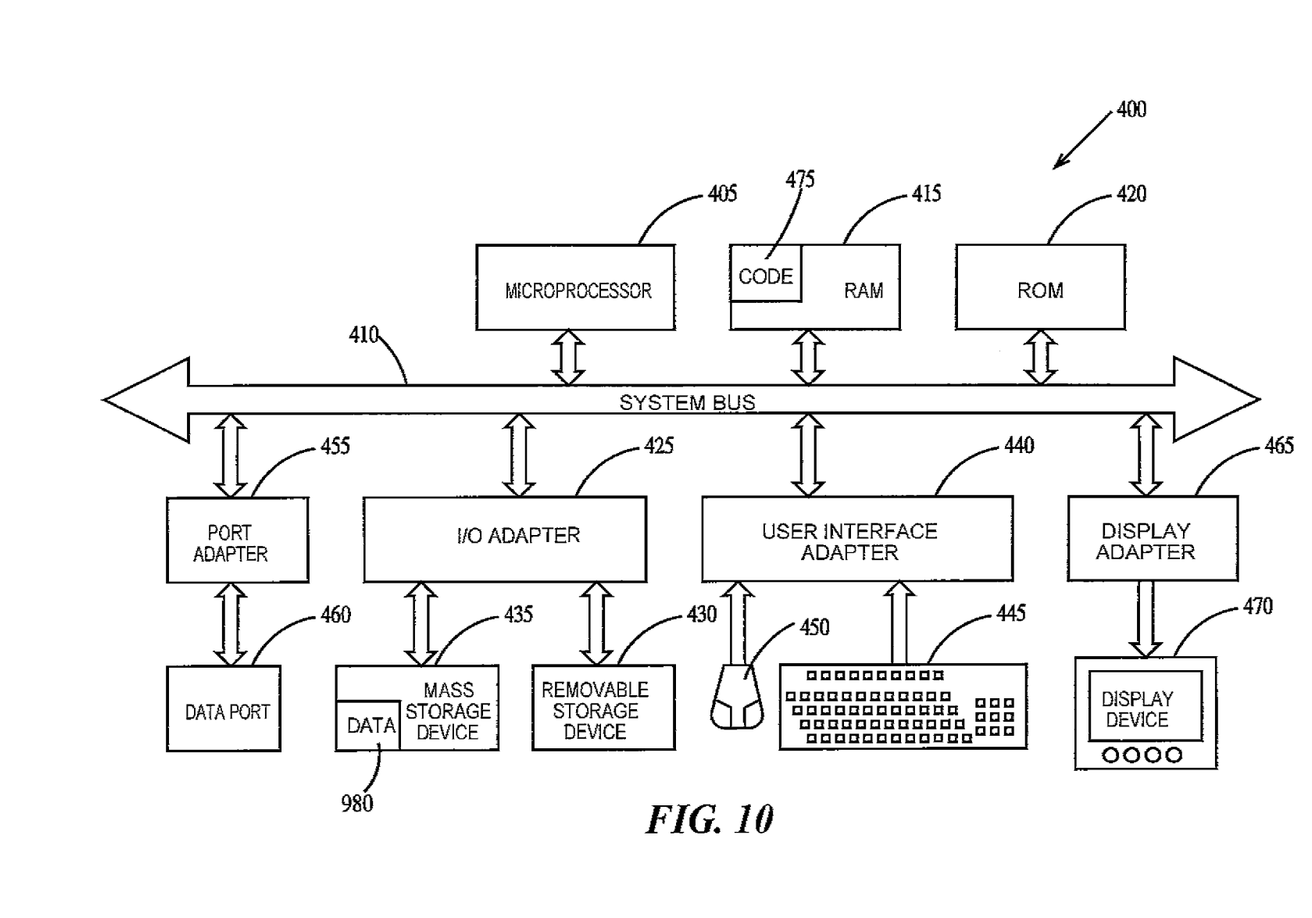
FIG. 10 is a schematic block diagram of a general-purpose computer.

FIG. 10 is a schematic block diagram of a general-purpose computer. In FIG. 10, computer tool 400 has at least one microprocessor or central processing unit (CPU) 405. CPU 405 is interconnected via a tool bus 410 to a random access memory (RAM) 415, a read-only memory (ROM) 420, an input/output (I/O) adapter 425 for a connecting a removable data and/or program storage device 430 and a mass data and/or program storage device 435, a user interface adapter 440 for connecting a keyboard 445 and a mouse 450, a port adapter 455 for connecting a data port 460 and a display adapter 465 for connecting a display device 470.

ROM 420 contains the basic operating tool for computer tool 400. The operating tool may alternatively reside in RAM

415 or elsewhere as is known in the art. Examples of removable data and/or program storage device 630 include magnetic media such as floppy drives and tape drives and optical media such as CD ROM drives. Examples of mass data and/or program storage device 435 include electronic, magnetic, optical, electromagnetic, infrared, and semiconductor devices. Examples of a computer-readable medium include a semiconductor or solid-state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD. In addition to keyboard 445 and mouse 450, other user input devices such as trackballs, writing tablets, pressure pads, microphones, light pens and position-sensing screen displays may be connected to user interface 440. Examples of display devices include cathode-ray tubes (CRT) and liquid crystal displays (LCD).

A computer program with an appropriate application interface may be created by one of skill in the art and stored on the tool or a data and/or program storage device to simplify the practicing of this invention. In operation, information for or the computer program created to run the present invention is loaded on the appropriate removable data and/or program storage device 430, fed through data port 460 or typed in using keyboard 445.

Thus the embodiments of the present invention provide an apparatus, a method of designing the apparatus, a tool using the apparatus and a method of using the apparatus for optimizing optical photolithography during formation of integrated circuits.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method of designing an asymmetrical complementary dipole element, comprising:
   (a) selecting critical design images of a design of an integrated circuit fabrication level;
   (b) selecting or generating an initial asymmetrical complementary dipole design and designating said initial design asymmetrical complementary dipole design as a current asymmetrical complementary dipole design, said current asymmetrical complementary dipole design always consisting of first dipole openings passing a first intensity of light and a second dipole openings passing a second intensity of light in an opaque substrate, said first intensity of light always greater than said second intensity of light, and said first dipole openings always having an area greater than an area of said second dipole openings;
   (c) simulating exposure of a photoresist layer using first parameters describing said critical design images and second parameters describing said current asymmetrical complementary dipole design to generate simulated images of said critical design images;
   (d) evaluating third parameters describing said simulated image; and
   (e) if said third parameters are not acceptable, only modifying one or more of said second parameters and only repeating steps (c) and (d) and if said third parameters are acceptable, selecting said current asymmetrical complementary dipole design.

2. The method of claim 1, wherein said second parameters comprise one or more of A1, A2, Ri1, Ro1, Ri2, Ro2, $OD_{CRIT}$ and $OD_{comp}$.

3. The method of claim 1 wherein,
   said first parameters include a width W and length L of said design images and a first spacing Sx between adjacent images of said design images in a X-direction and a second spacing Sy between adjacent images of said design images in a Y-direction; and
   said third parameters describe a mean sized shape, a maximum sized shape and a minimum sized shape of said simulated images.

4. The method of claim 1, wherein said first dipole is symmetrical about a first axis in a first and non-critical direction for improving resolution of said critical design images in a second and critical direction and said second dipole is symmetrical about a second axis in said second direction for improving resolution of said critical design images in said first direction, said second direction perpendicular to said first direction.

5. The method of claim 1, wherein said second parameters include $OD_{CRIT}$ and $OD_{COMP}$.

6. The method of claim 1, wherein (i) said second parameters include a first area of said first opening, a second area of said second opening, a third area of said third opening and a fourth area of said fourth opening, (ii) said first and second area are constrained to be the same, (iii) said third and fourth areas are constrained to be the same, and (iv) said first area is constrained to be greater than said third area.

7. The method of claim 1, wherein said second parameters include said first optical density and said second optical density and said first optical density is constrained to be less than 0.1 and said second optical density is constrained to be between 0.2 and 0.9.

8. The method of claim 1, wherein said second parameters include said first optical density and said second optical density and said first optical density is constrained to be 0 and said second optical density is constrained between 0.2 and 0.9.

9. The method of claim 1, wherein (i) said first parameters include a width and a length of a critical design image of said critical design images, (ii) said third parameters include a length and a width of a simulated image of said critical design image, (iii) wherein a minimum length of said simulated image is less than said length of said critical design image and a minimum width of said simulated image is less than said width of said critical design image, and (iv) wherein a maximum length of said simulated image is greater than said length of said critical design image and a maximum width of said simulated image is greater than said width of said critical design image.

* * * * *